United States Patent
Lee

(10) Patent No.: US 7,989,230 B2
(45) Date of Patent: Aug. 2, 2011

(54) METHOD FOR PMOS DEVICE PROCESSING USING A POLYSILICON FOOTING CHARACTERISTIC TO ACHIEVE LOW LEAKAGE

(75) Inventor: Chia Hao Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 232 days.

(21) Appl. No.: 12/238,689

(22) Filed: Sep. 26, 2008

(65) Prior Publication Data

US 2009/0269865 A1    Oct. 29, 2009

(30) Foreign Application Priority Data

Apr. 28, 2008 (CN) .......................... 2008 1 0036944

(51) Int. Cl.
*H01L 21/00* (2006.01)
(52) U.S. Cl. ................... 438/14; 438/197; 257/E21.001
(58) Field of Classification Search .............. 438/14–18, 438/142, 197; 257/E21.001
See application file for complete search history.

(56) References Cited

U.S. PATENT DOCUMENTS

| 6,622,059 B1* | 9/2003 | Toprac et al. | 700/121 |
| 2008/0286887 A1* | 11/2008 | Goo et al. | 438/15 |

FOREIGN PATENT DOCUMENTS

CN     101075267 A     11/2007

OTHER PUBLICATIONS

Office Action of Chinese Application No. 200810036944.9, dated Apr. 29, 2010, 5 pages total (English translation not included).

* cited by examiner

*Primary Examiner* — Brook Kebede
(74) *Attorney, Agent, or Firm* — Kilpatrick Townsend and Stockton LLP

(57) ABSTRACT

A method for manufacturing a MOS device. The method includes providing a semiconductor substrate. The method forms a gate dielectric layer overlying the semiconductor substrate and a polysilicon gate overlying the gate dielectric layer. The polysilicon gate is characterized by a thickness, a width and a polysilicon footing profile. In a specific embodiment, the method performs a TCAD simulation and determines a response of device performance due to the polysilicon footing profile from the model. The method uses the model to provide a process control window for fabricating the polysilicon gate.

11 Claims, 10 Drawing Sheets

H≈L
TYPE 1

H>L
TYPE 2

H<L
TYPE 3

| | 0 | 1 | 2 | 3 | 4 | 5 | 6 | 7 |
|---|---|---|---|---|---|---|---|---|
| Foot height (nm) | 0 | 1 | 2 | 3 | 4 | 5 | 6 | 7 |
| Foot length (nm) | 0 | 1 | 2 | 3 | 4 | 5 | 6 | 7 |
| Vth (v) | 0.529 | 0.532 | 0.536 | 0.54 | 0.545 | 0.55 | 0.555 | 0.562 |
| Idsat (uA/um) | 287 | 285 | 282 | 279 | 275 | 271 | 265 | 260 |
| Ioff (pA/um) | 997 | 961 | 918 | 832 | 750 | 665 | 581 | 480 |
| Vth mv shift | 0.0 | 3.0 | 7.0 | 11.0 | 16.0 | 21.0 | 26.0 | 33.0 |
| Idsat shift % | 0.0 | 0.70 | 1.74 | 2.88 | 4.18 | 5.57 | 7.67 | 9.41 |
| Ioff(pA/um) | 0.0 | 3.6 | 7.92 | 16.5 | 24.8 | 33.3 | 41.7 | 51.9 |
| Cgd (fF/um) | 0.250 | 0.247 | 0.243 | 0.237 | 0.230 | 0.223 | 0.216 | 0.208 |

FIGURE 9

| Foot height (nm) | 0 | 1 | 2 | 3 | 4 | 5 | 6 | 7 |
|---|---|---|---|---|---|---|---|---|
| Foot length (nm) | 0 | 2 | 2 | 2 | 2 | 2 | 2 | 2 |
| Vth (v) | 0.529 | 0.533 | 0.536 | 0.538 | 0.54 | 0.542 | 0.545 | 0.548 |
| Idsat (uA/um) | 287 | 284 | 282 | 280 | 278 | 276 | 273 | 270 |
| Ioff (pA/um) | 997 | 950 | 908 | 853 | 821 | 779 | 734 | 701 |
| Vth mv shift | 0.0 | 5.0 | 7.0 | 9.0 | 11.0 | 13.0 | 16.0 | 19.0 |
| Idsat shift % | 0.0 | 1.05 | 1.74 | 2.44 | 3.13 | 3.83 | 4.88 | 5.92 |
| Ioff(pA/um) | 0.0 | 4.71 | 8.93 | 14.44 | 17.65 | 21.87 | 26.38 | 29.69 |
| Cgd (fF/um) | 0.250 | 0.248 | 0.245 | 0.242 | 0.238 | 0.234 | 0.230 | 0.225 |

FIGURE 10

| Foot height (nm) | 0 | 2 | 2 | 2 | 2 | 2 | 2 |
|---|---|---|---|---|---|---|---|
| Foot length (nm) | 0 | 1 | 2 | 3 | 4 | 5 | 6 | 7 |
| Vth (v) | 0.529 | 0.532 | 0.536 | 0.539 | 0.542 | 0.546 | 0.552 | 0.557 |
| Idsat (uA/um) | 287 | 285 | 282 | 278 | 274 | 271 | 268 | 285 |
| Ioff (pA/um) | 997 | 951 | 908 | 855 | 782 | 710 | 655 | 602 |
| Vth mv shift | 0.0 | 3.0 | 7.0 | 10.0 | 13.0 | 17.0 | 23.0 | 28.0 |
| Idsat shift % | 0.0 | 0.7 | 1.98 | 3.16 | 4.53 | 5.57 | 6.62 | 7.67 |
| Ioff(pA/um) | 0.0 | 4.61 | 8.93 | 14.24 | 21.56 | 28.79 | 34.3 | 39.62 |
| Cgd (fF/um) | 0.250 | 0.246 | 0.241 | 0.236 | 0.231 | 0.225 | 0.218 | 0.211 |

FIGURE 11

| Poly-CD shift (nm) | 0 | 1 | 2 | 3 | 4 | 5 | 6 | 7 |
|---|---|---|---|---|---|---|---|---|
| V th (v) | 0.529 | 0.535 | 0.542 | 0.551 | 0.558 | 0.565 | 0.572 | 0.58 |
| Idsat (uA/um) | 287 | 283 | 275 | 267 | 258 | 252 | 245 | 238 |
| Ioff (pA/um) | 997 | 867 | 765 | 642 | 502 | 399 | 290 | 187 |
| Vth mv shift | 0.0 | 6.0 | 13.0 | 22.0 | 29.0 | 36.0 | 43.0 | 51.0 |
| Idsat shift % | 0.0 | -2.93 | -4.18 | -6.97 | -10.1 | -12.19 | -14.63 | -17.07 |
| Ioff(pA/um) | 0.0 | -13.03 | -23.26 | -35.61 | -49.65 | -59.96 | -70.91 | -81.24 |

FIGURE 12

METHOD FOR PMOS DEVICE PROCESSING USING A POLYSILICON FOOTING CHARACTERISTIC TO ACHIEVE LOW LEAKAGE

CROSS-REFERENCES TO RELATED APPLICATIONS

This application claims priority to Chinese Patent Application No. 200810036944.9, filed Apr. 28, 2008, commonly assigned, and incorporated herein by reference.

BACKGROUND OF THE INVENTION

The present invention is directed to integrated circuits and their processing for the manufacture of semiconductor devices. More particularly, the invention provides a method and a structure for fabricating a polysilicon gate structure for manufacturing a PMOS device. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed.

An example of such a limit is in polysilicon gate processing. As device line width is reduced, polysilicon gate geometry plays an important role in device performance. These and other limitations will be described in further detail throughout the present specification and more particularly below.

From the above, it is seen that an improved technique for processing semiconductor devices is desired.

BRIEF SUMMARY OF THE INVENTION

According to embodiments of the present invention, a method and a structure for forming a MOS device is provided. More particularly, embodiments according to the present invention provide a method and a structure for fabricating polysilicon gate structure having a polysilicon footing profile. Merely by ways of example, the present invention has been applied to manufacturing of a MOS structure having a line width of 65 nm and less. But it would be recognized that the present invention has a broader range of applicability.

In a specific embodiment, the method includes providing a semiconductor substrate having a surface region. The semiconductor substrate can be a single crystal silicon wafer, a silicon germanium wafer, or a silicon on insulator (SOI) and the like. The method includes forming a gate dielectric layer overlying the semiconductor substrate and forming a polysilicon gate overlying a portion of the gate dielectric layer. The polysilicon gate is characterized by a thickness, a width and a polysilicon footing profile. In a specific embodiment, the method provides a simulation model for the polysilicon footing profile and determines a response of a device performance due to the polysilicon footing profile from the model. The method then provides a process control window from the model for the polysilicon footing profile for fabricating the polysilicon gate.

Many benefits are achieved by way of the present invention over conventional techniques. For example, the present technique provides an easy to use process that relies upon conventional technology. In a specific embodiments, the present method allows for a process window for fabricating a polysilicon gate for a MOS device. In some embodiments, the method provides higher device yields in dies per wafer. In some embodiments, the method provides MOS devices having improved threshold leakage current, Idsat, and Ioff, among others. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detail

BRIEF DESCRIPTION OF THE DRAWINGS

FIG. 9 to 15 are simplified diagrams illustrating experiment results according to an embodiment of the present invention.

DETAILED DESCRIPTION OF THE INVENTION

According to embodiments of the present invention, a method and a system for semiconductor device processing are provided. In particular, embodiments according to the present invention provides a process control methodology for fabricating polysilicon gate structure. The invention has been applied to MOS structure having a 65 nm design rule and beyond. But it would be recognize that embodiments according to the present invention have a much broader range of applicability.

Figure 1:
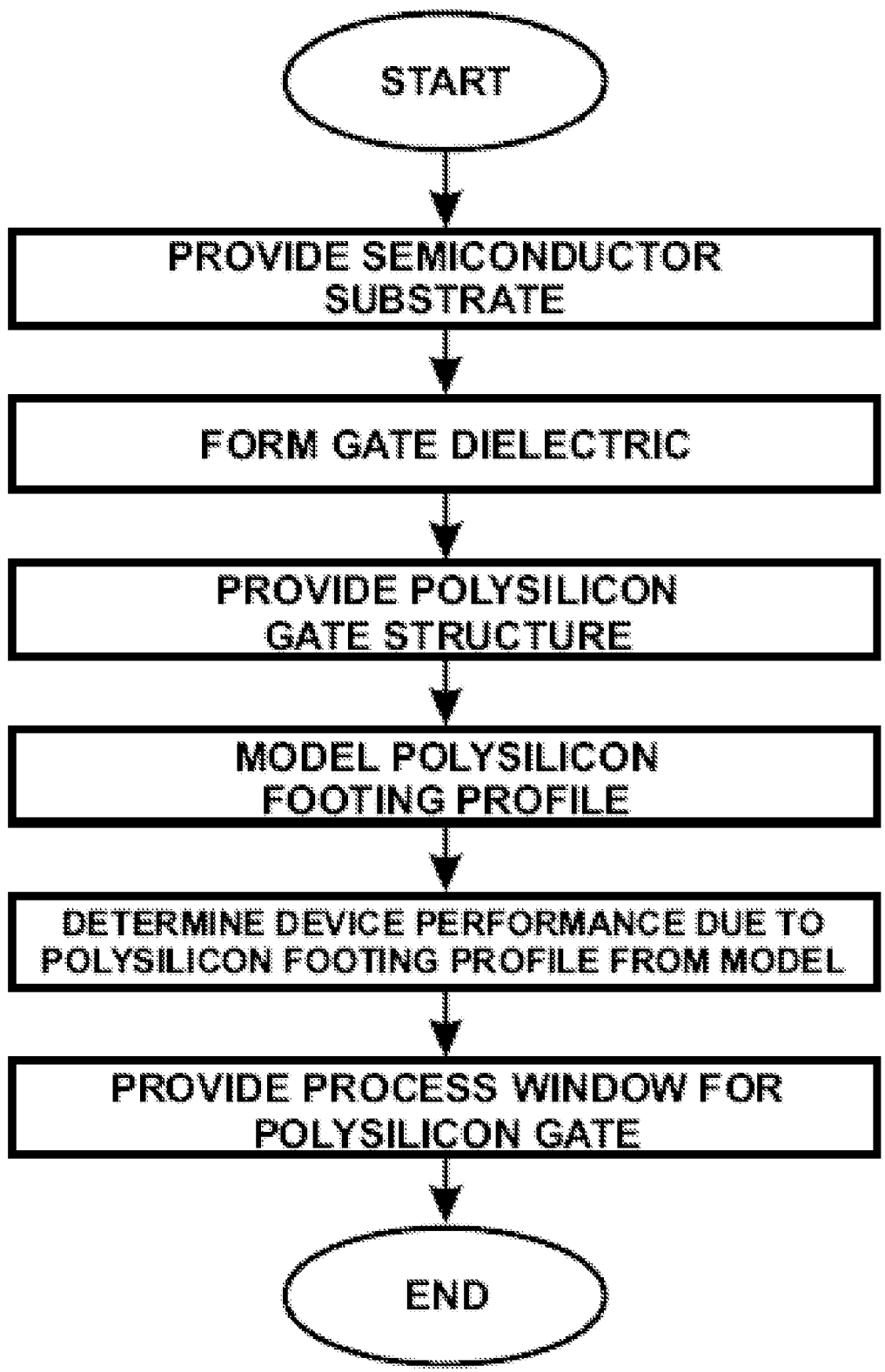
FIG. 1 is a simplified flow diagram illustrating a method for MOS processing according to an embodiment of the present invention.

FIG. 1 is a simplified flow diagram illustrating a method for MOS processing according to an embodiment of the present invention. As shown, the method begins with a Start step. The method includes providing a semiconductor substrate including a surface region. The semiconductor substrate can be a silicon wafer, a silicon on insulator (SOI), and the like. The method forms a gate dielectric layer overlying the surface region. The method also includes forming a polysilicon gate structure overlying a portion of the gate dielectric layer. In a specific embodiment, the method includes providing a simulation model for device performance data, for example, Vth, Idsat, Ioff, and others as a function of a polysilicon footing profile. The method uses the simulation model to provide a process control window for fabrication the polysilicon gate in a specific embodiment.

The above sequence of steps provides a method of forming a polysilicon gate structure for a MOS device according to an embodiment of the present invention. As shown, the method uses a combination of steps including a method for forming an integrated circuit device for a MOS integrated circuit. As show, the method includes using a modeling step to determine a process control window for forming the polysilicon gate for the MOS device according to an embodiment of the present invention. Other alternatives can also be provided where steps are added, one or more steps are removed, or one or more steps are provided in a different sequence without departing from the scope of the claims herein. Further details of the present method can be found throughout the present specification and particularly below.

Figure 2:
FIGS. 2-3 are simplified diagrams illustrating a method for fabricating a MOS device according to an embodiment of the present invention.
Figure 3:
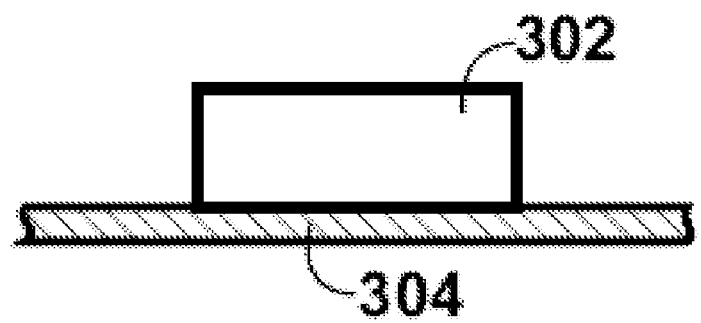

FIG. 2-3 are simplified diagrams illustrating a method for forming a polysilicon gate structure according to an embodiment of the present invention. As shown in FIG. 2, a semiconductor substrate 202 including a surface region 204 is provided. The semiconductor substrate can be a silicon wafer, a silicon germanium wafer, a silicon on insulator (SOI) substrate and the like.

As shown in FIG. 3, the method includes forming a polysilicon gate structure 302 overlying a gate dielectric layer 304. The gate dielectric layer overlies the surface region of the gate dielectric layer. The polysilicon gate structure can be formed using a combination of deposition, patterning and etching process steps. Of course there can be other modifications, variations, and alternatives.

Figure 4:
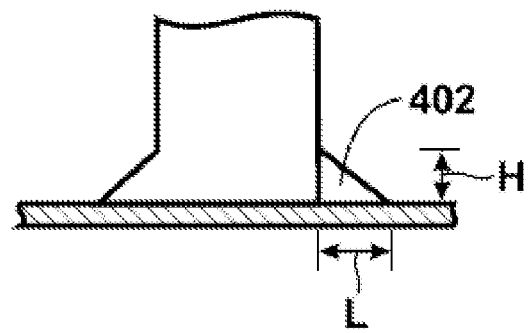
FIGS. 4-8 are simplified diagrams illustrating various polysilicon footing profile configurations according to an embodiment of the present invention.
Figure 5:
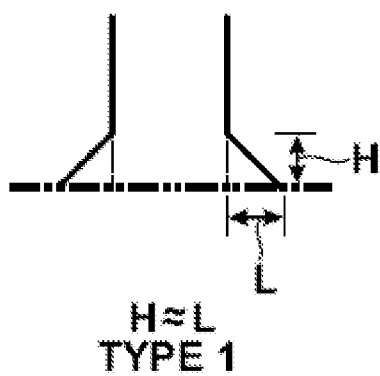
Figure 6:
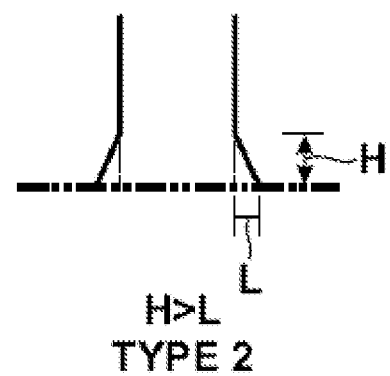
Figure 7:
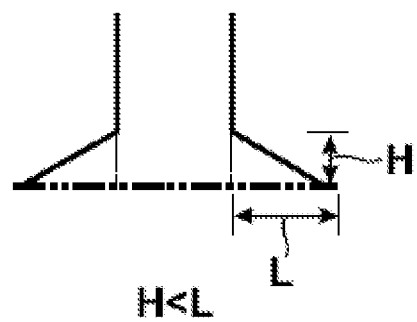
Figure 8:
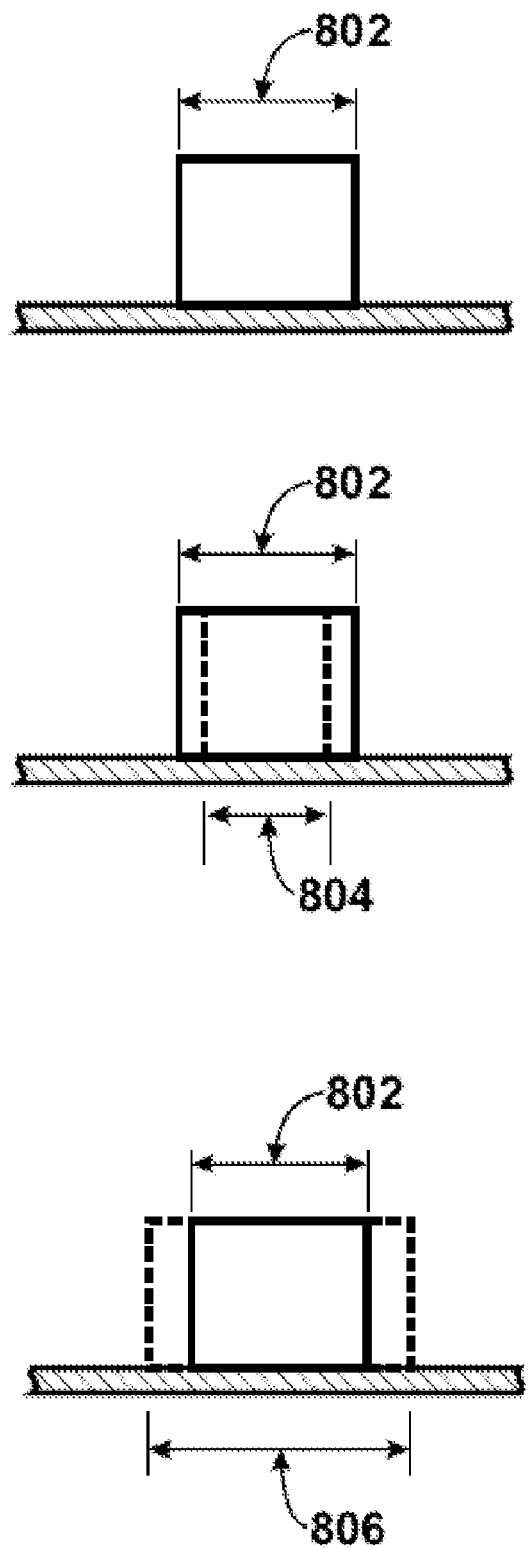

Referring to FIG. 4, the polysilicon gate structure is characterized by a polysilicon footing profile 402 in a specific embodiment. The polysilicon footing profile has a height H and a length L. The length L is in contact with the gate dielectric layer as shown. The polysilicon footing profile can be a result of certain etching parameters, among others. As shown in FIG. 5-7, a Type 1 footing profile is characterized by L≈H, a Type 2 footing profile is characterized by L<H, and a Type 3 footing profile is characterized by L>H. As shown in FIG. 8, the polysilicon gate is also characterized by a critical dimension 802, in other embodiment, the polysilicon gate may have a critical dimension (CD) shift. As shown, the polysilicon gate can have a negative CD shift 804 or a positive CD shift 806. Of course there can be other modifications, variations, and alternatives.

In a specific embodiment, a TCAD modeling is performed to determine device performance as a function of the polysilicon footing profile. As illustrated in FIG. 9-11, tabulated results of TCAD simulated device parameters as a function of polysilicon footing profile for a device line width of 45 nm are provided. As shown, device parameters such as threshold voltage (Vth), saturation current (Idsat), channel turn off leakage current (Ioff), capacitance of gate to drain (Cgd0), among others are sensitive to polysilicon footing profile. As shown in FIG. 9, for a Type 1 footing profile (L≈H) as the footing height and the footing length of the polysilicon footing profile are increased from zero to 7 nm respectively, threshold voltage, Vth shifts from 0.529 volt to 0.562 volt, an upward shift of 33 mV, saturation current (Idsat) decreases from 287 uA/um to 260 uA/um, a decrease of 9.41%, current off saturation current (Ioff) decreases from 997 pA/um to 480 pA/um, a decrease of about 51.9%, and Cgd0 decreases from 0.250 fF/um to 0.208 fF/um.

FIG. 10 is a table showing TCAD simulated device parameters as a function of a Type 2 (L<H) polysilicon footing profile according to an embodiment of the present invention. As shown, as footing height is increased from zero to 7 nm and footing length is maintained at 2 nm, threshold voltage, Vth shifts from 0.529 volt to 0.548 volt, an upward shift of 19 mV, saturation current (Idsat) decreases from 287 uA/um to 270 uA/um, a decrease of 5.92%, and current off saturation current (Idsat) decreases from 997 pA/um to 701 pA/um, a decrease of about 29.69%, and Cgd0 decreases from 0.250 fF/um to 0.225 fF/um.

FIG. 11 is a table showing TCAD simulated device parameters as a function of a Type 3 (L>H) polysilicon footing profile according to an embodiment of the present invention. As shown, as footing length is increased from zero to 7 nm and footing height is maintained at 2 nm, threshold voltage, Vth shifts from 0.529 volt to 0.557 volt, an upward shift of 28 mV, saturation current (Idsat) decreases from 287 uA/um to 265 uA/um, a decrease of 7.67%, and current off saturation current (Ioff) decreases from 997 pA/um to 602 pA/um, a decrease of about 39.62%, and Cgd0 decreases from 0.250 fF/um to 0.211 fF/um FIG. 12 is a table showing TCAD simulated device parameters as a function of a Type 4 (critical dimension CD shift) polysilicon footing profile according to an embodiment of the present invention. As shown, as critical dimension shift is increased from zero to 7 nm, threshold voltage, Vth shifts from 0.529 volt to 0.58 volt, an upward shift of 51 mV, saturation current (Idsat) decreases from 287 uA/um to 238 uA/um, a decrease of 17.07%, and current off saturation current (Ioff) decreases from 997 pA/um to 187 pA/um, a decrease of about 81.24%.

Figure 13:
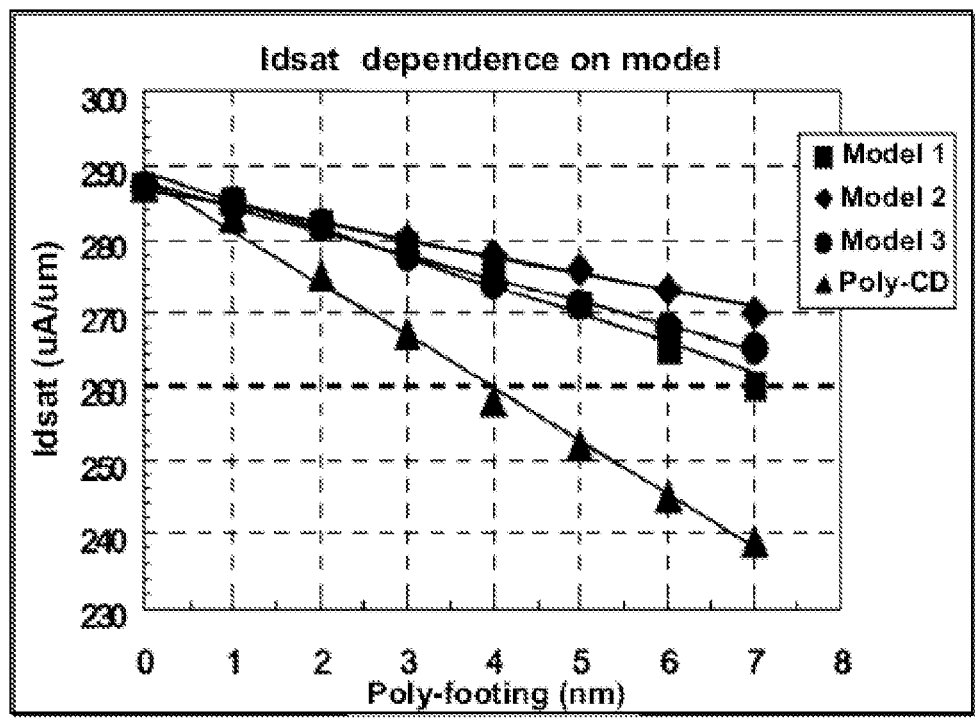
Figure 14:
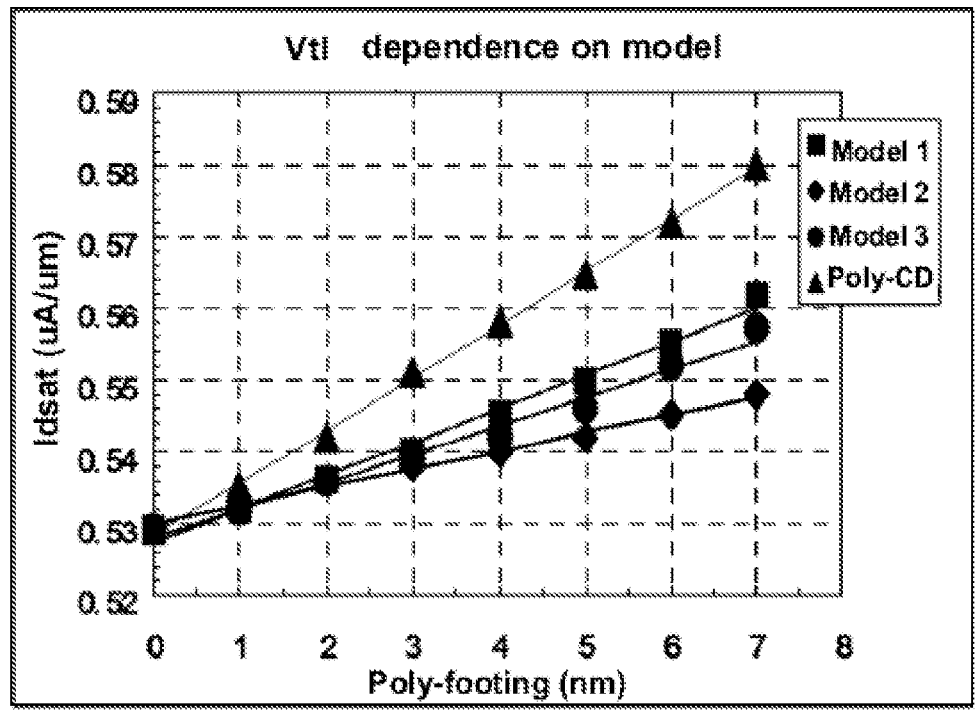
Figure 15:
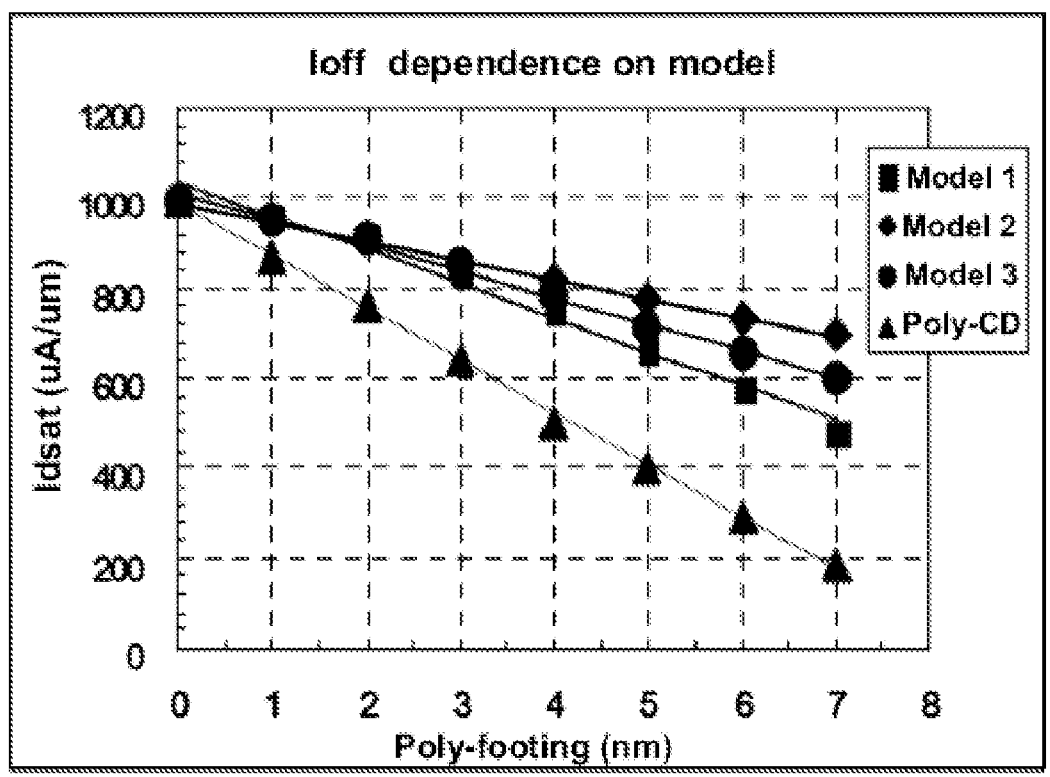

FIG. 13 to 15 are simplified plots summarizing TCAD simulated device parameters as a function of polysilicon footing profile according to an embodiment of the present invention. As shown in FIG. 13, plots of Idsat dependence on the polysilicon footing profile is illustrated. Plot A is a simplified plot of saturated current (Idsat) as a function of dimension of Type 1 (L≈H) polysilicon footing profile, Plot B is a simplified plot of Idsat as a function of dimension of Type 2 polysilicon footing profile, Plot C is a simplified plot of Idsat as a function of dimension of Type 3 polysilicon footing profile, and Plot D is a simplified plot of Idsat as a function of polysilicon CD shift according to an embodiment of the present invention. As shown, Idsat generally decreases with an increase of polysilicon footing dimension.

FIG. 14 is a simplified plot of threshold voltage (Vth) dependence on the polysilicon footing profile. Plot E is a simplified plot of Vth as a function of dimension of Type 1 (L≈H) polysilicon footing profile, Plot F is a simplified plot of Vth as a function of dimension of Type 2 polysilicon footing profile, Plot G is a simplified plot of Vth as a function of dimension of Type 3 polysilicon footing profile, and Plot H is a simplified plot of Vth as a function of polysilicon CD shift according to an embodiment of the present invention. As shown, Vth generally increases with an increase of polysilicon footing dimension.

FIG. 15 is a simplified plot of leakage current (Ioff) dependence on the polysilicon footing profile. Plot I is a simplified plot of Ioff as a function of dimension of Type 1 (L≈H) polysilicon footing profile, Plot J is a simplified plot of Ioff as a function of dimension of Type 2 polysilicon footing profile, Plot K is a simplified plot of Ioff as a function of dimension of Type 3 polysilicon footing profile, and Plot L is a simplified plot of Ioff as a function of polysilicon CD shift according to an embodiment of the present invention. As shown, Ioff generally decreases with an increase of polysilicon footing profile dimension.

In a specific embodiment, the TCAD simulated device parameters are used for process control window and in-line process control and for polysilicon gate fabrication.

Although the above has been illustrated according to a specific embodiment, there can be other modifications, alternatives, and variations. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing an MOS device, the method comprises:
   providing a semiconductor substrate including a surface region;
   forming a gate dielectric layer overlying the surface region of the semiconductor substrate;
   forming a polysilicon gate overlying the gate dielectric layer, the polysilicon gate being characterized by a thickness, a width and a polysilicon footing profile;
   providing a simulation model for the polysilicon footing profile;
   determining a response of a device performance due to the polysilicon footing profile from the model; and
   providing a process control window from the model for the polysilicon footing profile for fabricating the polysilicon gate.

2. The method of claim 1 wherein the semiconductor substrate can be a single crystal silicon wafer, a silicon on insulator (SOI) wafer, silicon germanium, and others.

3. The method of claim 1 wherein the model for polysilicon footing profile is provided using TCAD.

4. The method of claim 1 wherein the polysilicon footing profile is characterized by a height (H), and a length (L), the length being in contact with the gate dielectric layer and the height being a portion of the thickness of the polysilicon gate in a vicinity of the gate dielectric layer.

5. The method of claim 1 wherein the polysilicon gate structure is fabricated using a deposition, pattern, and etch process.

6. The method of claim 1 wherein the device performance includes threshold voltage ($V_{th}$), saturation current (Idast), channel turn off leakage current (Ioff), capacitance of gate to drain (Cgd0), and others.

7. The method of claim 1 wherein the MOS device is characterized by a line width of 65 nm and less.

8. The method of claim 1 wherein the polysilicon footing profile is characterized by a height (H) and a length (L), the length being in contact with the dielectric layer.

9. The method of claim 8 wherein the polysilicon footing profile is characterized by H≈L.

10. The method of claim 8 wherein the polysilicon footing profile is characterized by H>L.

11. The method of claim 8 wherein the polysilicon footing profile is characterized by H<L.

* * * * *